(12) United States Patent
Nishikawa et al.

(10) Patent No.: US 6,953,969 B2
(45) Date of Patent: Oct. 11, 2005

(54) MOSFET FOR AN OPEN-DRAIN CIRCUIT AND SEMICONDUCTOR INTEGRATED CIRCUIT DEVICE EMPLOYING IT

(75) Inventors: Hidetoshi Nishikawa, Kyoto (JP); Masahiko Sonoda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/730,995

(22) Filed: Dec. 10, 2003

(65) Prior Publication Data

US 2004/0119120 A1 Jun. 24, 2004

(30) Foreign Application Priority Data

Dec. 20, 2002 (JP) ........................................ 2002-370525

(51) Int. Cl.[7] .......................... H01L 29/76; H01L 29/94
(52) U.S. Cl. ...................... 257/335; 257/341; 257/343
(58) Field of Search ............................... 257/107, 133, 257/335–339, 341–343, 350; 438/152, 155, 156, 309, 311

(56) References Cited

U.S. PATENT DOCUMENTS 6,576,934 B2 * 6/2003 Cheng et al. ............... 257/107
6,724,043 B1 * 4/2004 Ekkanath Madathil ...... 257/341

FOREIGN PATENT DOCUMENTS

JP          3204168          6/2001

* cited by examiner

*Primary Examiner*—Hung Vu
(74) *Attorney, Agent, or Firm*—Arent Fox, PLLC

(57) ABSTRACT

In a conventional N-channel MOSFET for an open-drain circuit, when a positive static electric charge is applied to its drain, there is no route by way of which to discharge the static electric charge, resulting in a rather low static withstand voltage. To overcome this, according to the invention, an open-drain N-channel MOSFET has a drain region formed of an N-type semiconductor layer, a P-type impurity diffusion layer formed within the drain region, two high-concentration N-type impurity diffusion layers formed within the drain region so as to sandwich the P-type impurity diffusion layer, and a drain electrode connected to the P-type impurity diffusion layer and to the two high-concentration N-type impurity diffusion layers. When a positive static electric charge is applied to the drain, a parasitic transistor appears that forms a route by way of which the static electric charge is discharged.

2 Claims, 4 Drawing Sheets

MOSFET FOR AN OPEN-DRAIN CIRCUIT AND SEMICONDUCTOR INTEGRATED CIRCUIT DEVICE EMPLOYING IT

This application is based on Japanese Patent Application No. 2002-370525 filed on Dec. 20, 2002, the contents of which are hereby incorporated by reference.

BACKGROUND OF THE INVENTION

1. Field of the Invention

The present invention relates to the structure of a MOSFET (metal-oxide semiconductor field-effect transistor) for an open-drain circuit, and to a semiconductor integrated circuit device employing such a MOSFET. More particularly, the present invention relates to an improvement on the withstand voltage of a MOSFET for an open-drain circuit.

2. Description of the Prior Art

Conventionally, an open-drain output circuit as shown in FIG. 4 has been widely used as the output circuit of a semiconductor integrated circuit device. An input terminal 101 is connected to the gate of an N-channel MOSFET (hereinafter referred to as the "NMOS") for an open-drain circuit. The drain of the NMOS 102 is connected to an output terminal 103, and the source of the NMOS 102 is connected to ground. To the input terminal 101 of the output circuit is fed, for example, a signal output from a CMOS (complementary metal-oxide semiconductor) logic circuit provided in the semiconductor integrated circuit device.

In the open-drain output circuit shown in FIG. 4, when a high-level signal is fed to the input terminal 101, the NMOS 102 turns on, turning the output terminal 103 to a low level. On the other hand, when a low-level signal is fed to the input terminal 101, the NMOS 102 turns off, bringing the output terminal 103 into an electrically floating state (a high-impedance state). At the drain, a parasitic diode Di is formed.

In a non-operating state, (i.e., when the NMOS 102 is off), an abnormal static electric charge may be applied to the output terminal 103 for some reason or other. In the open-drain output circuit shown in FIG. 4, while a negative static electric charge is readily discharged by way of the parasitic diode Di, there is no route by way of which to discharge a positive static electric charge. As a result, when a static electric charge higher than the gate withstand voltage or drain-source withstand voltage of the NMOS 102 is applied to the output terminal 103, the NMOS 102 is liable to be destroyed between its drain and gate or between its drain and source.

FIG. 5 is a sectional view schematically showing the conventional NMOS structure used as the NMOS 102. The conventional NMOS structure is formed in a device-forming region between field oxide films (LOCOS) 2a and 2b on a P-type semiconductor substrate 1 such as a silicon substrate.

On the P-type semiconductor substrate 1, high-concentration N-type impurity diffusion regions (source regions 3a and 3b and a drain region 4) are formed. Between the field oxide films 2a and 2b and the source regions 3a and 3b, high-concentration P-type impurity diffusion regions 5a and 5b are formed. Between the source regions 3a and 3b and the drain region 4, contiguous with the drain region 4, low-concentration N-type impurity diffusion regions 6a and 6b are formed, with a LOCOS 7a formed on top of the low-concentration N-type impurity diffusion region 6a and a LOCOS 7b formed on the low-concentration N-type impurity diffusion region 6b. On top of the channel regions between the source regions 3a and 3b and the low-concentration N-type impurity diffusion regions 6a and 6b, gate insulating films 8a and 8b are formed, with polysilicon films formed as gate electrodes 9a and 9b on top of the gate insulating films 8a and 8b. The drain region 4 is connected to a drain lead electrode D. The gate electrodes 9a and 9b are connected to a gate lead electrode G. The source regions 3a and 3b are connected to a source lead electrode S. The high-concentration P-type impurity diffusion regions 5a and 5b are connected to a backgate lead electrode BG. In the low-concentration regions (N⁻ and P-sub), parasitic resistance components R1' and R2' are formed respectively. Parasitic resistance components are formed also in the high-concentration regions constituting the drain and source, but these are not illustrated, because their resistances are low as compared with that of the parasitic resistance component R1'.

FIG. 6 shows the equivalent circuit of a conventionally structured MOSFET in its state in which the source lead electrode S and the backgate lead electrode BG are kept at an equal potential. In FIG. 6, such circuit elements as are found in FIG. 5 are identified with the same reference symbols. The drain lead electrode D is connected through the parasitic resistor R1' to the drain of the MOSFET 16 and to the collector of an NPN-type parasitic transistor Q1. The base of the parasitic transistor Q1 is connected to one end of the parasitic resistor R2'. The source of the MOSFET 16, the emitter of the parasitic transistor Q1, and the other end of the parasitic resistor R2' are connected to the source lead electrode S and to the backgate lead electrode BG.

In the conventionally structured NMOS shown in FIG. 5, when a positive static electric charge is applied to the drain lead electrode D, the NMOS 16 and the parasitic transistor Q1 both remain off (see FIG. 6), and therefore there is no route by way of which to discharge the static electric charge. This makes the static withstand voltage of the conventionally structured NMOS rather low, specifically as low as +300 V to +600 V as measured under the HBM (human body model) condition, or +150 V to +250 V as measured under the MM (machine model) condition.

Incidentally, Japanese Patent Registered No. 3204168 discloses an invention relating to a semiconductor integrated circuit that can alleviate the lowering of the on-state withstand voltage of a transistor. However, this publication discloses nothing about the static withstand voltage of a MOSFET for an open-drain circuit.

SUMMARY OF THE INVENTION

An object of the present invention is to provide an N-channel MOSFET for an open-drain circuit which has a high static withstand voltage, and to provide a semiconductor integrated circuit device employing such a MOSFET.

To achieve the above object, according to one aspect of the present invention, an open-drain N-channel MOSFET is provided with a drain region formed of an N-type semiconductor layer, a P-type impurity diffusion layer formed within the drain region, two high-concentration N-type impurity diffusion layers formed within the drain region so as to sandwich the P-type impurity diffusion layer, and a drain electrode connected to the P-type impurity diffusion layer and to the two high-concentration N-type impurity diffusion layers.

According to another aspect of the present invention, a semiconductor integrated circuit device is provided with an output circuit incorporating an open-drain N-channel MOS- FET structured as described above, with the drain of the MOSFET connected to the output terminal of the output circuit. In a case where the semiconductor integrated circuit device incorporates a plurality of such output circuits, in the open-drain N-channel MOSFET structured as described above, the peripheral portion of the drain region and the peripheral portion of the source region may each be given, as seen in a plan view, a substantially circular shape or a substantially regular-polygonal shape with four or more sides, with the gates formed in a net-like pattern.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
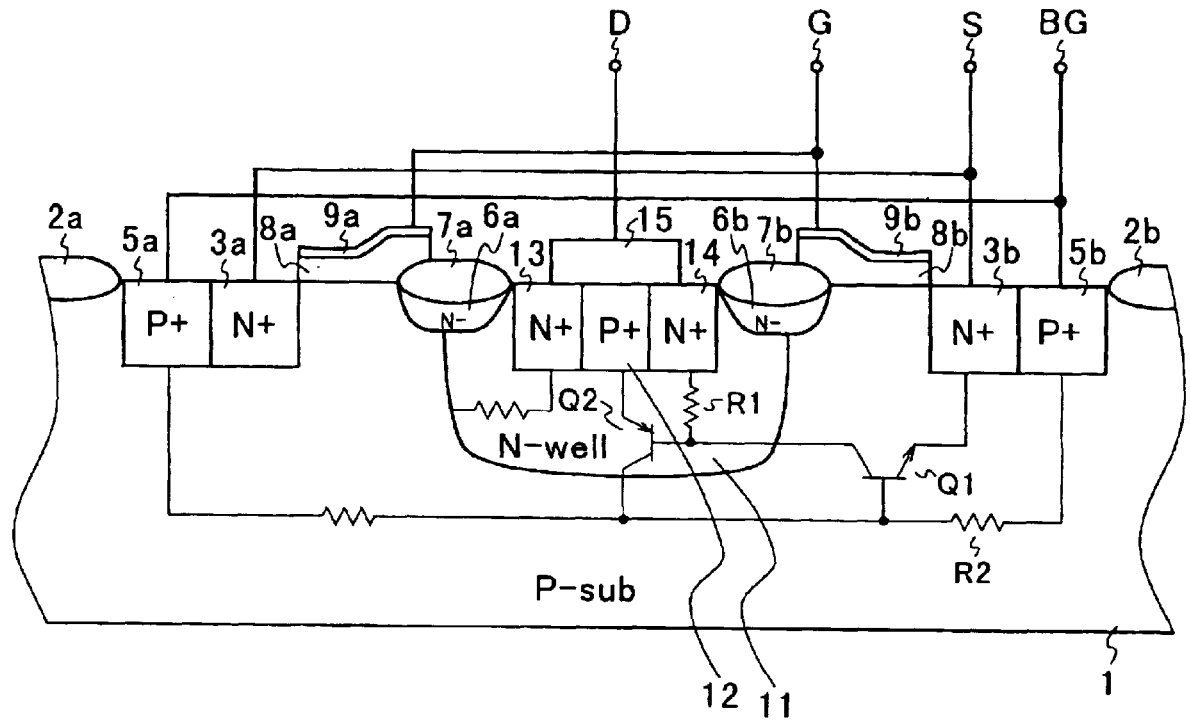
FIG. 1 is a diagram showing the structure of an open-drain N-channel MOSFET according to the invention.
Figure 5:
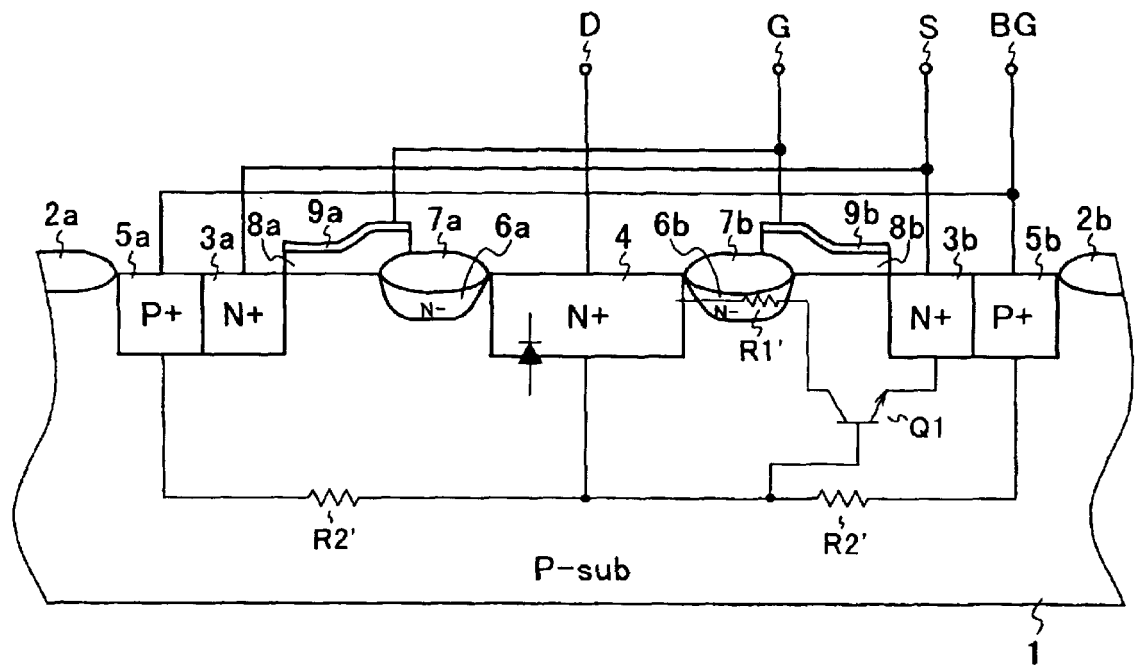
FIG. 5 is a sectional view schematically showing the structure of a conventional MOSFET.

FIG. 1 shows the structure of an N-channel MOSFET for an open-drain circuit according to the invention. In FIG. 1, such circuit elements as are found in FIG. 5 are identified with the same reference symbols.

The open-drain N-channel MOSFET according to the invention is formed in a device-forming region between field oxide films 2a and 2b on a P-type semiconductor substrate 1 such as a silicon substrate. The P-type semiconductor substrate 1 may be replaced with a P well.

On the P-type semiconductor substrate 1, an N-type well 11 is formed, and high-concentration N-type impurity diffusion regions are formed as source regions 3a and 3b. Between the field oxide films 2a and 2b and the source regions 3a and 3b, high-concentration P-type impurity diffusion regions 5a and 5b are formed. In the N well 11, a high-concentration P-type impurity diffusion region 12 is formed, and two high-concentration N-type impurity diffusion regions 13 and 14 are formed so as to sandwich the high-concentration P-type impurity diffusion region 12. On top of a region covering the high-concentration P-type impurity diffusion region 12 and parts of the high-concentration N-type impurity diffusion regions 13 and 14, a drain electrode 15 is formed. Contiguous with the high-concentration N-type impurity diffusion regions 13 and 14 formed in the N well 11, low-concentration N-type impurity diffusion regions 6a and 6b are formed so as to bridge from the N well 11 to the P-sub region. A LOCOS 7a is formed on top of the low-concentration N-type impurity diffusion region 6a, and a LOCOS 7b is formed on the low-concentration N-type impurity diffusion region 6b. On top of the channel regions between the source regions 3a and 3b and the low-concentration N-type impurity diffusion regions 6a and 6b, gate insulating films 8a and 8b are formed, with polysilicon or aluminum films formed as gate electrodes 9a and 9b on top of the gate insulating films 8a and 8b. The drain electrode 14 is connected to a drain lead electrode D. The gate electrodes 9a and 9b are connected to a gate lead electrode G. The source regions 3a and 3b are connected to a source lead electrode S. The high-concentration P-type impurity diffusion regions 5a and 5b are connected to a backgate lead electrode BG. In the low-concentration regions (N-well and P-sub), parasitic resistance components R1 and R2 are formed respectively.

Figure 2:
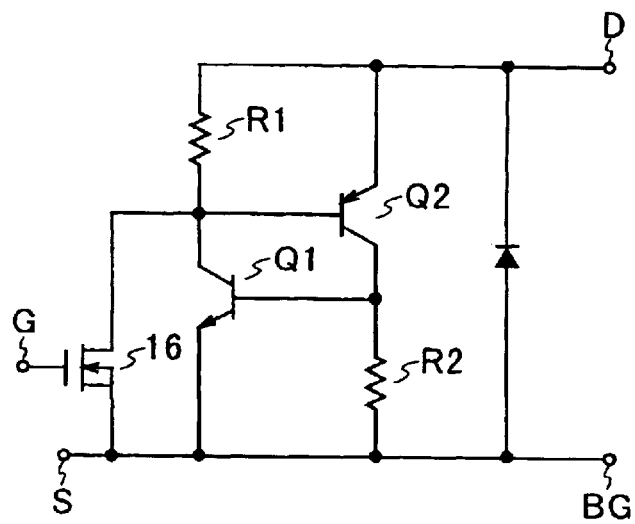
FIG. 2 is a diagram showing the equivalent circuit of the open-drain N-channel MOSFET of the invention shown in FIG. 1.
Figure 6:
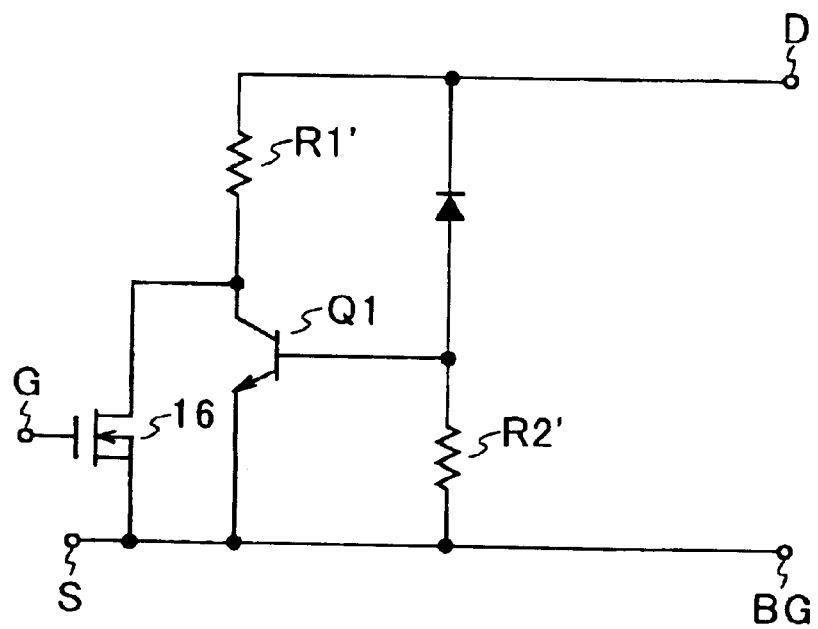
FIG. 6 is a diagram showing the equivalent circuit of the conventionally structured MOSFET shown in FIG. 5.

FIG. 2 shows the equivalent circuit of the open-drain N-channel MOSFET of the invention in its state in which the source lead electrode S and the backgate lead electrode BG are kept at an equal potential. In FIG. 2, such circuit elements as are found in FIG. 6 are identified with the same reference symbols. The drain lead electrode D is connected through the parasitic resistor R1 to the drain of the MOSFET 16, to the collector of an NPN-type parasitic transistor Q1, and to the base of a PNP-type parasitic transistor Q2. The node between the drain lead electrode D and the parasitic resistor R1 is connected to the emitter of the parasitic transistor Q2. The base of the parasitic transistor Q1 is connected to one end of the parasitic resistor R2. The node between the base of the parasitic transistor Q1 and the parasitic resistor R2 is connected to the collector of the parasitic transistor Q2. The source of the MOSFET 16, the emitter of the parasitic transistor Q1, and the other end of the parasitic resistor R2 are connected to the source lead electrode S and to the backgate lead electrode BG.

In the open-drain N-channel MOSFET of the invention shown in FIG. 1, only when a positive static electric charge is applied to the drain lead electrode D and thus the potential difference between the drain lead electrode D and the source lead electrode S is great, the parasitic transistor Q2 turns on and a current flows through it, forming a route by way of which the static electric charge is discharged. As a result, as compared with the conventionally structured MOSFET shown in FIG. 5, the open-drain N-channel MOSFET of the invention has a satisfactorily high static withstand voltage, specifically as high as ±4000 V as measured under the HBM condition, or ±400 V as measured under the MM condition.

Figure 4:
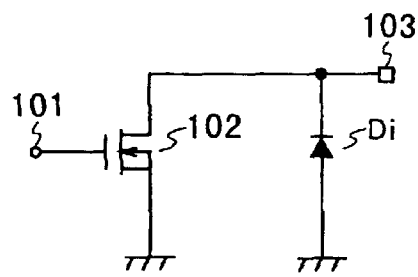
FIG. 4 is a diagram showing the configuration of an open-drain output circuit.

It is advisable to use the open-drain N-channel MOSFET shown in FIG. 1 in a semiconductor integrated circuit device incorporating an open-drain output circuit (for example, the output circuit shown in FIG. 4). This helps improve the static withstand voltage of the open-drain MOSFET, and thus helps enhance the reliability of the semiconductor integrated circuit device.

Figure 3A:
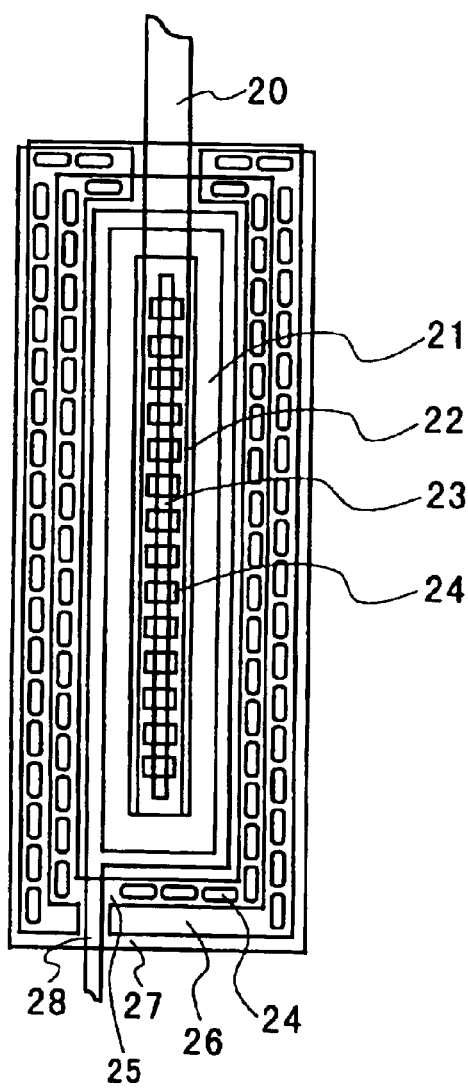
FIG. 3A is a diagram showing a layout with low area efficiency for an open-drain N-channel MOSFET.
Figure 3B:
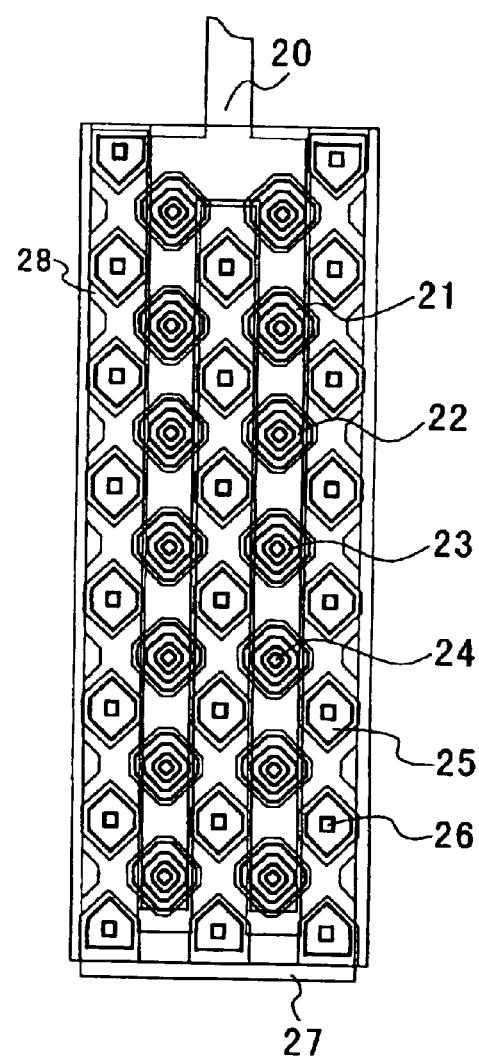
FIG. 3B is a diagram showing a layout with high area efficiency for an open-drain N-channel MOSFET.

The open-drain N-channel MOSFET shown in FIG. 1 requires a large drain area. Therefore, in a semiconductor integrated circuit device incorporating a plurality of open-drain output circuits employing the open-drain N-channel MOSFET shown in FIG. 1, it is preferable to adopt, as the layout of the open-drain N-channel MOSFET, a layout with high area efficiency as shown in a schematic plan view in FIG. 3B rather than a layout with low area efficiency as shown in a schematic plan view in FIG. 3A. Adopting the layout with high area efficiency shown in a schematic plan view in FIG. 3B helps reduce the size and cost of the semiconductor integrated circuit device. In FIGS. 3A and 3B, the following reference numerals are used: 20 represents a drain conductor; 21 represents a locos; 22 represents a drain; 23 represents a contact; 24 represents a high-concentration P-type diffusion region; 25 represents a high-concentration N-type diffusion region; 26 represents a high-concentration P-type diffusion region; 27 represents a source/backgate conductor; and 28 represents a gate conductor. In the layout shown in FIG. 3A, the distance from the gate to the drain is made greater than that from the source contact to the gate. Moreover, in the layout shown in FIG. 3A, high-concentration P-type diffusion regions and high-concentration N-type diffusion regions are arranged alternately as the drain. Moreover, in the layout shown in FIG. 3A, the backgate is located in an outermost portion of the MOSFET. By contrast, in the layout shown in FIG. 3B, the drain and source are each arranged in a pattern like the teeth of a comb. Moreover, in the layout shown in FIG. 3B, the drain and source are given different shapes (whereas the former is substantially square, the latter is substantially regular hexagonal). Giving the drain and source different shapes in this way helps further increase the area efficiency. Moreover, in the layout shown in FIG. 3B, the backgate is located uniformly within the transistor. Moreover, in the layout shown in FIG. 3B, the gates are laid in a net-like pattern (with the drain and source located at the eyes of the net).

What is claimed is:

1. A semiconductor integrated circuit device comprising:
   an output circuit,
   wherein the output circuit comprises:
   an open-drain N-channel MOSFET; and
   an output terminal connected to a drain of the open-drain N-channel MOSFET,
   wherein the open-drain N-channel MOSFET comprises:
   a drain region formed of an N-type semiconductor layer;
   a P-type diffusion layer formed within the drain region;
   two high-concentration N-type impurity diffusion layers formed within the drain region so as to sandwich the P-type impurity diffusion layer;
   a low concentration N-type impurity diffusion region formed in contact with the drain region; and
   a drain electrode connected to the P-type impurity diffusion layer and to the two high-concentration N-type impurity diffusion layers,
   wherein there are provided a plurality of the output circuit,
   wherein a peripheral portion of the drain region of the open-drain N-channel MOSFET and a peripheral portion of a source region of the open-drain N-channel MOSFET each have, as seen in a plan view, a substantially circular shape or a substantially regular-polygonal shape with four or more sides, and gates of the open-drain N-channel MOSFET are formed in a net-like pattern.

2. The semiconductor integrated circuit device as claimed in claim 1,
   wherein the drain region and the source region of the open-drain N-channel MOSFET are formed in a pattern like teeth of a comb, and
   wherein the peripheral portion of the region of the open-drain N-channel MOSFET and the peripheral portion of the source region of the open-drain N-channel MOSFET have, as seen in a plan view, different shapes.

* * * * *